United States Patent
Cowley et al.

(10) Patent No.: US 12,256,162 B2
(45) Date of Patent: Mar. 18, 2025

(54) REFERENCE PIXEL COLUMN READOUT

(71) Applicant: SEMICONDUCTOR COMPONENTS INDUSTRIES, LLC, Phoenix, AZ (US)

(72) Inventors: Nicholas Paul Cowley, Wroughton (GB); Andrew David Talbot, Chieveley (GB)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 190 days.

(21) Appl. No.: 17/938,208

(22) Filed: Oct. 5, 2022

(65) Prior Publication Data

US 2024/0121527 A1 Apr. 11, 2024

(51) Int. Cl.
*H04N 25/671* (2023.01)
*H01L 27/146* (2006.01)
(Continued)

(52) U.S. Cl.
CPC ..... *H04N 25/671* (2023.01); *H01L 27/14623* (2013.01); *H01L 27/14634* (2013.01);
(Continued)

(58) Field of Classification Search
CPC ...... H04N 25/671; H04N 25/75; H04N 25/77; H04N 25/79; H04N 25/46; H04N 25/673;
(Continued)

(56) References Cited

U.S. PATENT DOCUMENTS 6,130,712 A * 10/2000 Miyazaki ............... H04N 25/63
348/E5.081
9,596,425 B2 * 3/2017 Ohshitanai ........... H04N 25/778
(Continued)

FOREIGN PATENT DOCUMENTS

EP      1471729 A2    10/2004

OTHER PUBLICATIONS

Huang et al., "CMOS image sensor binning circuit for low-light imaging," 2011 IEEE Symposium on Industrial Electronics and Applications, Sep. 25-28, 2011, Langkawi, Malaysia, pp. 586-589.
(Continued)

*Primary Examiner* — Chiawei Chen
(74) *Attorney, Agent, or Firm* — Treyz Law Group, P.C.; Tianyi He

(57) ABSTRACT

An image sensor may include an image sensor pixel array. The image sensor pixel array may include active image sensor pixels that generate image data based on incident light and reference pixels that are optically black for generating reference data for noise compensation. Sets of reference pixels in the same row may be coupled to respective shared readout paths in a source follower binning configuration. The shared readout path may be could to downstream readout circuits. The use of shared readout paths for the reference pixels can reduce the number of reference pixel readout paths. If desired, pixel circuitry may be implemented on a first die, while readout circuitry and at least a portion of the reference pixel readout paths may be implemented on a second die mounted to the first die.

20 Claims, 6 Drawing Sheets

(51) Int. Cl.
*H04N 25/75* (2023.01)
*H04N 25/77* (2023.01)
*H04N 25/79* (2023.01)

(52) U.S. Cl.
CPC ............ *H04N 25/75* (2023.01); *H04N 25/77* (2023.01); *H04N 25/79* (2023.01)

(58) Field of Classification Search
CPC .... H04N 25/677; H04N 25/40; H04N 25/441; H01L 27/14623; H01L 27/14634
See application file for complete search history.

(56) References Cited

U.S. PATENT DOCUMENTS

| | | | |
|---|---|---|---|
| 2006/0006426 A1* | 1/2006 | Inaba | H04N 25/633 348/E5.081 |
| 2006/0243890 A1 | 11/2006 | Bock | |
| 2008/0012966 A1 | 1/2008 | Beck et al. | |
| 2009/0033779 A1* | 2/2009 | Mo | H04N 25/76 348/308 |
| 2011/0128420 A1* | 6/2011 | Moore | H04N 25/76 348/E5.079 |
| 2011/0298956 A1* | 12/2011 | Giffard | H01L 27/14609 348/308 |
| 2014/0354866 A1* | 12/2014 | Yoo | H04N 25/78 348/308 |
| 2018/0097030 A1* | 4/2018 | Manabe | H01L 27/14643 |
| 2018/0332246 A1* | 11/2018 | Sanchez | H04N 25/76 |
| 2020/0314364 A1* | 10/2020 | Kim | H04N 25/447 |
| 2022/0060646 A1* | 2/2022 | Sato | H04N 25/709 |

OTHER PUBLICATIONS

Liu et al., "A Fixed-Pattern Noise Correction Method Based on Gray Value Compensation for TDI CMOS Image Sensor," Sensors. Sep. 16, 2015, 15, 23496-23513.

* cited by examiner

REFERENCE PIXEL COLUMN READOUT

BACKGROUND

This relates generally to imaging systems, and more specifically, to image sensors in the imaging systems.

Image sensors are commonly used in electronic systems or devices to generate image data. In a typical arrangement, an image sensor includes an image sensor array having active image sensor pixels. Based on control signals received along control paths, the active image sensor pixels generate image signals in response to incident light. The generated image signals are read out along readout paths and are used to generate one or more image frames usable in the electronic system.

To compensate for fixed pattern noise, the image sensor array can also include reference image sensor pixels in addition to active image sensor pixels. Signals from the reference image sensor pixels are similarly read out using corresponding readout paths. As the number of reference image sensor pixels increase, noise compensation improves. However, the inclusion of excess reference image sensor pixels can take away area that otherwise could be used to form active image sensor pixels.

It is within this context that the embodiments herein arise.

DETAILED DESCRIPTION

Electronic systems and/or devices may include one or more image sensors that gather incoming light to capture images. The image sensor may include one or more arrays of image sensor pixels. The pixels in the image sensor may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
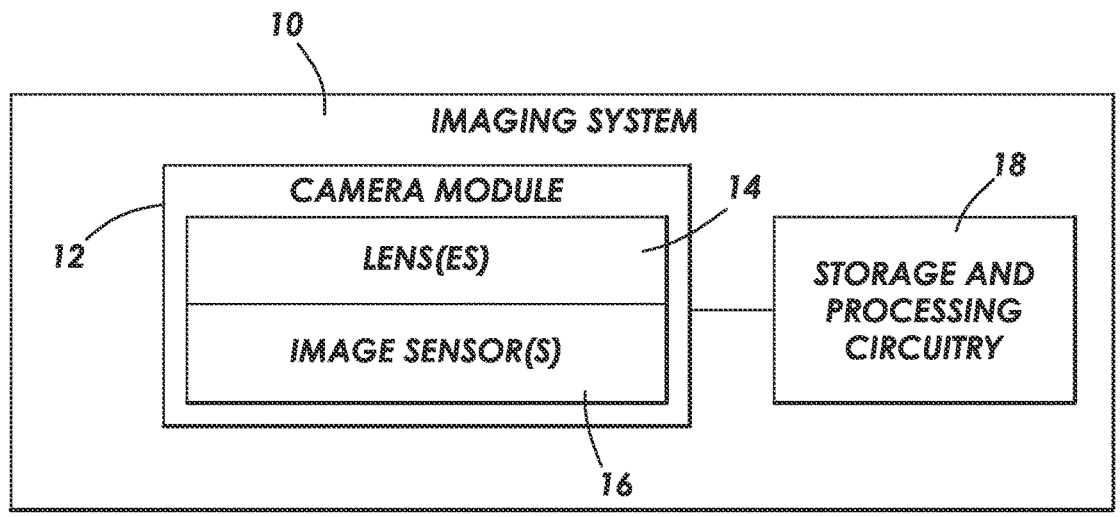
FIG. 1 is a functional block diagram of an illustrative system having one or more image sensors in accordance with some embodiments.

FIG. 1 is a functional block diagram of an illustrative imaging system such as an electronic device that uses an image sensor to capture images. Imaging system 10 of FIG. 1 may be a portable electronic device such as a camera, a cellular telephone, a tablet computer, a webcam, a video camera, a video surveillance system, an automotive imaging system, a video gaming system with imaging capabilities, an augmented reality and/or virtual reality system, an unmanned aerial vehicle system such as a drone, an industrial system, or any other desired imaging system or device that captures image data.

Camera module 12, sometimes referred to as an imaging module, may be used to convert incoming light into digital image data. Camera module 12 may include one or more lenses 14 and one or more image sensors 16. When capturing images, light from a scene may be focused onto each image sensor 16 by one or more lenses 14. Image sensor 16 may include circuitry for converting analog pixel image signals into corresponding digital image data that is provided to storage and processing circuitry 18.

Storage and processing circuitry 18 may include one or more integrated circuits, each serving data storage functions and/or data computation or processing functions. As examples, the one or more integrated circuits may include image processing circuits such as digital signal processors, application-specific integrated circuits, general-purpose processors, microprocessors, microcontrollers, storage devices such as random-access memory and non-volatile memory, and/or other types of integrated circuits having processors and/or memories.

Storage and processing circuitry 18 may be implemented using components that are separate from the camera module and/or components that form part of the camera module. As one example, storage and processing circuitry 18 may be implemented using circuits that form part of an integrated circuit that includes an image sensor 16 or an integrated circuit within camera module 12. When storage and processing circuitry 18 is included on different integrated circuits than those of image sensors 16, the integrated circuits with storage and processing circuitry 18 may be vertically stacked or packaged with respect to the integrated circuits with image sensors 16.

Image data that has been captured by camera module 12 may be processed and stored using processing circuitry 18. As examples, an image processing engine on processing circuitry 18, an imaging mode selection engine on processing circuitry 18, and/or other types of processing engines on processing circuitry 18 may process the image data captured by camera module 12. Processing circuitry 18 may, if desired, provide processed image data to external equipment such as a computer, an external display, or other devices using wired and/or wireless communication paths coupled to processing circuitry 18.

Figure 2:
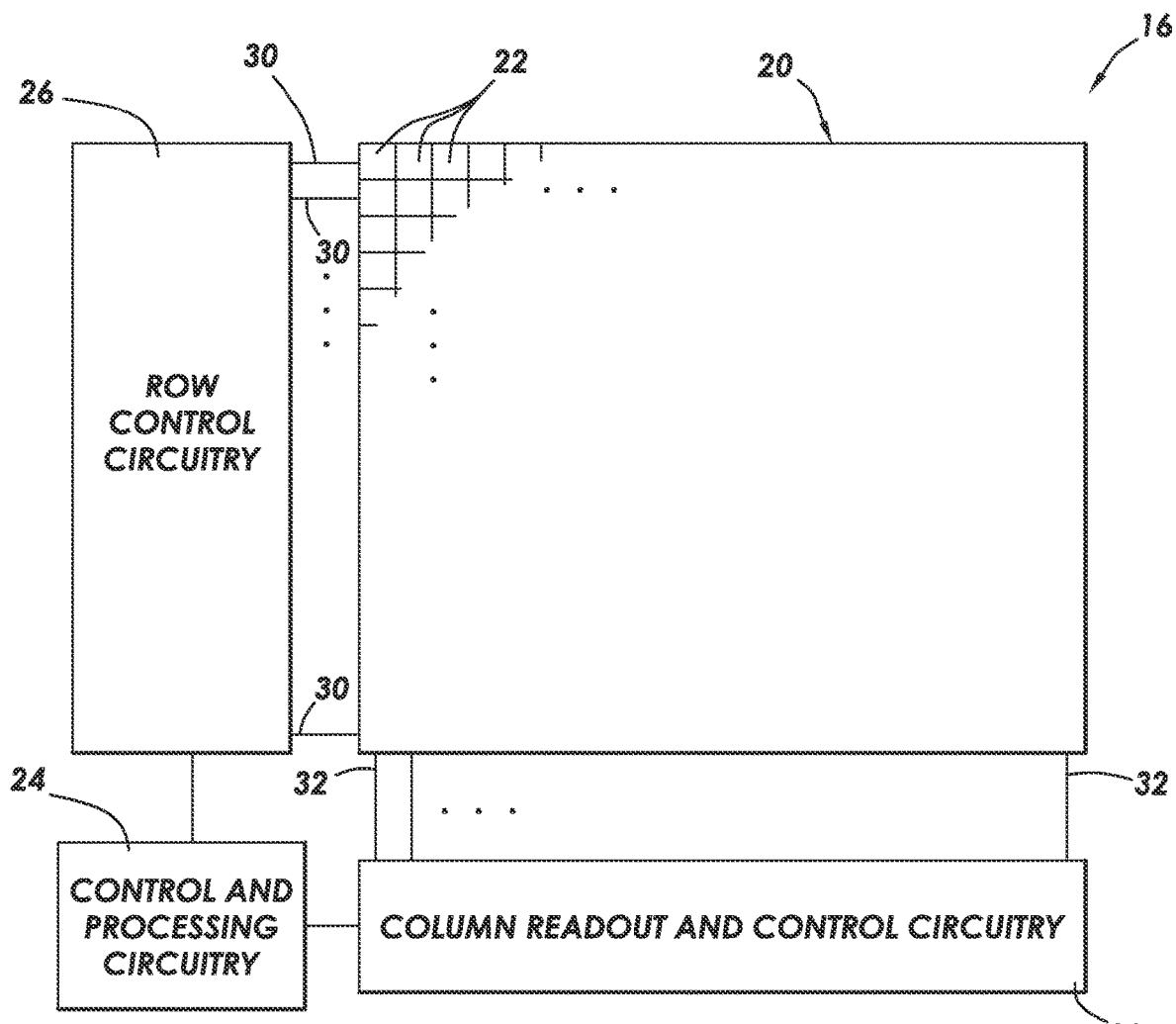
FIG. 2 is a functional block diagram of illustrative image sensor circuitry having an image sensor pixel array and control and readout circuitry for the pixel array in accordance with some embodiments.

As shown in FIG. 2, image sensor 16 may include a pixel array such as pixel array 20 containing image sensor pixels 22, which are sometimes referred to herein as image pixels or pixels, arranged in rows and columns. Image sensor 16 may include control and processing circuitry 24, sometimes referred to herein as control circuitry 24, that controls the operation of pixel array 20. Pixel array 20 may contain, for example, hundreds or thousands of rows and columns of image sensor pixels 22. Control circuitry 24 may be coupled to row control circuitry 26 such as row drivers that provide control signals to pixel array 20 and may be coupled to column readout and control circuitry 28 that read out signals from pixel array 20. Column readout and control circuitry 28 may sometimes referred to as column control circuitry, column readout circuitry, image readout circuitry, readout circuitry, or column decoder circuitry.

Row control circuitry 26 may receive row addresses and/or signals indicative of row addresses from control circuitry 24 and supply corresponding row control signals such as reset, anti-blooming, row-select, charge transfer, dual conversion gain, and readout control signals to pixels 22 over conductive lines or paths 30 such as pixel row control paths. In particular, each pixel row may receive different control signals over a corresponding number of control paths such that each pixel row is coupled to multiple conductive paths 30. One or more conductive lines or paths 32 such as pixel column readout paths may be coupled to each column of pixels 22. Conductive paths 32 may be used for reading out image signals from pixels 22 and for supplying bias signals such as bias currents or bias voltages to pixels 22. As an example, when performing a pixel readout operation, a pixel row in pixel array 20 may be selected using row control circuitry 26 and image signals generated by the selected image pixels 22 in that pixel row can be read out along conductive paths 32.

Column readout circuitry 28 may receive image signals such as analog pixel values generated by pixels 22 over conductive paths 32. Column readout circuitry 28 may include memory or buffer circuitry for temporarily storing calibration signals such as reset level signals, reference level signals, and/or other non-image signals read out from array 20 and for temporarily storing image level signals read out from array 20, amplifier circuitry or a multiplier circuit, analog to digital conversion (ADC) circuitry, bias circuitry, latch circuitry for selectively enabling or disabling portions of column readout circuitry 28, or other circuitry that is coupled to one or more columns of pixels in array 20 for operating pixels 22 and/or for reading out image signals from pixels 22. ADC circuitry in readout circuitry 28 may convert analog pixel values received from array 20 into corresponding digital pixel values, sometimes referred to as digital image data or digital pixel data. Column readout circuitry 28 may supply digital pixel data from pixels 22 in one or more pixel columns to control and processing circuitry 24 and/or processor 18 (FIG. 1) for further processing and/or storage.

If desired, pixel array 20 may be provided with a filter array having multiple visible color or non-visible filter elements each corresponding to a respective pixel, thereby allowing a single image sensor to sample light of different colors or sets of wavelengths.

Image sensor pixels 22 may be formed in a semiconductor substrate using complementary metal-oxide-semiconductor (CMOS) technology or charge-coupled device (CCD) technology or any other suitable photosensitive device technology. Image sensor pixels 22 may be frontside illumination (FSI) image sensor pixels or backside illumination (BSI) image sensor pixels.

Figure 3:
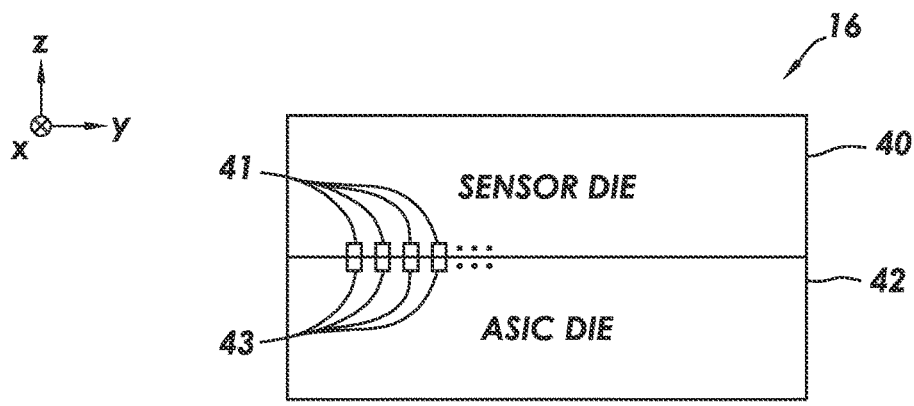
FIG. 3 is a diagram of an illustrative image sensor implemented using stacked integrated circuit dies in accordance with some embodiments.

In some illustrative arrangements described herein as an illustrative example, image sensor 16 may be implemented using an integrated circuit package or other structure in which multiple integrated circuit dies or chips are vertically stacked with respect to each other. FIG. 3 is a diagram illustrating an image sensor 16 implemented by mounting a first die to a second die. First die 40 may be stacked on top of second die 42. In the example of FIG. 3, first die 40 is a sensor integrated circuit die, and second die 42 is an application-specific integrated circuit (ASIC) die.

In this arrangement, sensor integrated circuit die 40 may implement pixel photosensitive elements such as photodiodes and other image sensor pixel elements such as pixel transistors, floating diffusion regions, capacitors or other analog charge storage elements. ASIC die 42 may implement pixel control circuitry such as circuitry for operating the pixel elements by providing control signals to pixel transistors (e.g., row control circuitry 26 in FIG. 2). ASIC die 42 may implement pixel readout circuitry such as circuitry for receiving and processing image signals and other pixel-generated signals from the pixel elements (e.g., column readout circuitry 28 in FIG. 2). ASIC die 42 may implement other support or peripheral circuitry for supporting the operation of image sensor 16 such as clock circuitry, input-output interface circuitry, and/or power management circuitry.

Die 40 may be mounted to die 42 in any suitable manner. As one illustrative example, die 40 may be bonded to die 42 at respective bonding surfaces on each die. Conductive interconnect structures 41 at the bonding surface of die 40 may be electrically connected to conductive interconnect structure 43 at the bonding surface of die 42. Accordingly, respective inter-die electrical connections may be made through pairs of interconnect structures 41 and 43, thereby facilitating signal conveyance between the two dies. As examples, conductive interconnect structures such as each interconnect structure 41 and/or 43 may include a die contact pad, a conductive via connected to the contact pads, one or more signal redistribution vias or layers, and/or one or more metal layers.

In one illustrative arrangement, die 40 may be bonded to die 42 using a hybrid bond process during which conductive structures such as metal interconnect structures 41 and 43 and non-conductive structures such as dielectric and/or semiconducting substrate layers at respective bonding surfaces of dies 40 and 42 may be fused together. If desired, die 40 may be mounted to die 42 in any other suitable manner such as using wire-bond connections, using flip-chip connections, and/or other connection mechanisms. Some or all of the mounting and inter-die connection process between dies 40 and 42 may occur at the wafer-to-wafer level, at the die-to-die level, and/or at the die-to-wafer level. Accordingly, depending on how die 40 is mounted to and/or is electrically connected to die 42, intervening connection elements such as solder bumps, micro bumps, and/or copper pillars may exist between corresponding pairs of interconnect structures 41 and 43. If desired, an additional substrate or interposer may be used to mount die 40 to die 42.

The configuration in which first die 40 implementing pixel circuitry is mounted to second die 42 implementing pixel control and readout circuitry is described herein as an illustrative example. However, the function and separation of elements between sensor integrated circuit die 40 and ASIC die 42 as described above are merely illustrative. If desired, some pixel elements may be implemented outside of die 40 such as on die 42 or on a third die. If desired, the ASIC die functionalities of pixel control, pixel readout, and/or image processing may be implemented separately on multiple dies instead of being implemented within a single ASIC die 42. While die 42 is sometimes referred to herein as an ASIC die, die 42 and/or any other dies in image sensor 16 may implement its functionalities using any other types of devices such as field-programmable gate array (FPGA) devices and/or System-on-Chip (SoC) devices.

Figure 4:
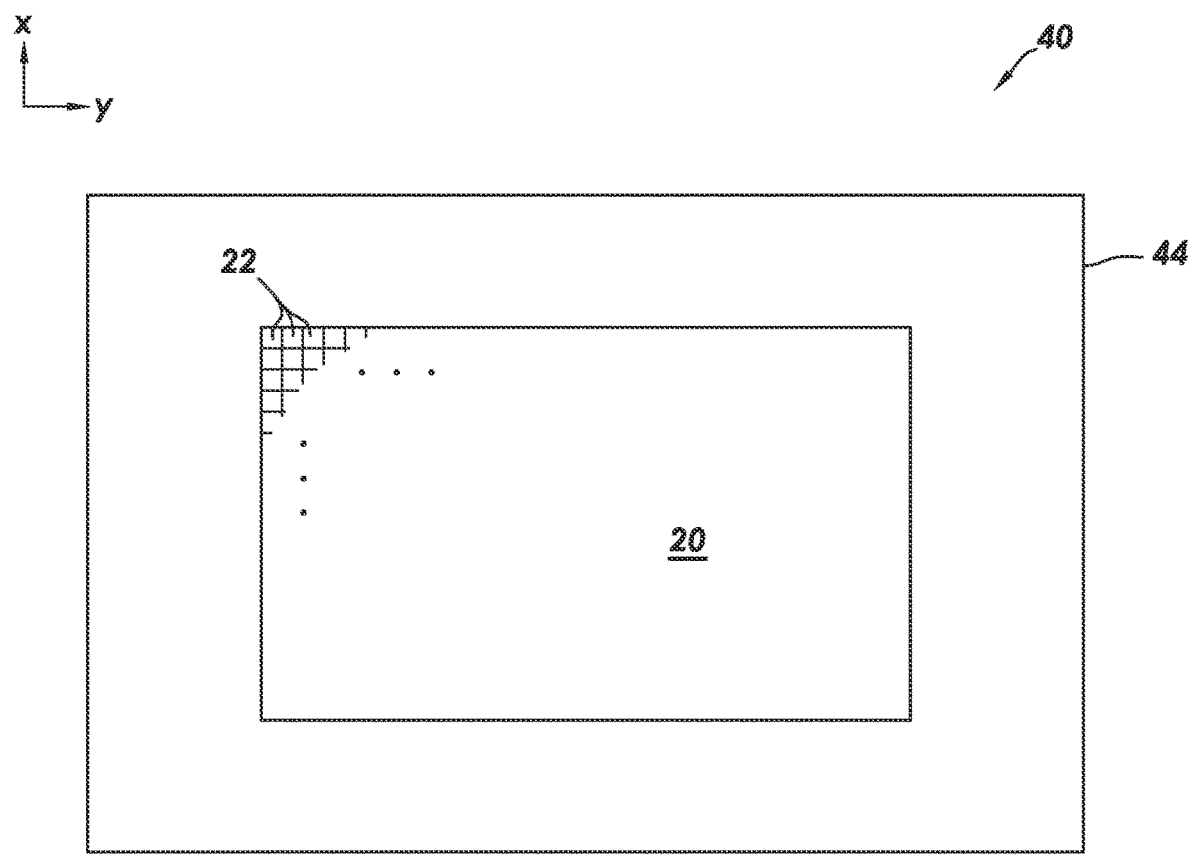
FIG. 4 is a plan view of an illustrative sensor integrated circuit die in accordance with some embodiments.

FIG. 4 is a plan view of a sensor integrated circuit die such as die 40, the peripheral side view of which is shown in FIG. 3. In the example of FIG. 4, integrated circuit die 40 may include a semiconductor substrate 44 such as a silicon substrate on which pixel elements such as transistors, photodiodes, and floating diffusion regions in pixels 22 are formed. Pixels 22 may be arranged in columns and rows that collectively form pixel array 20.

Figure 5:
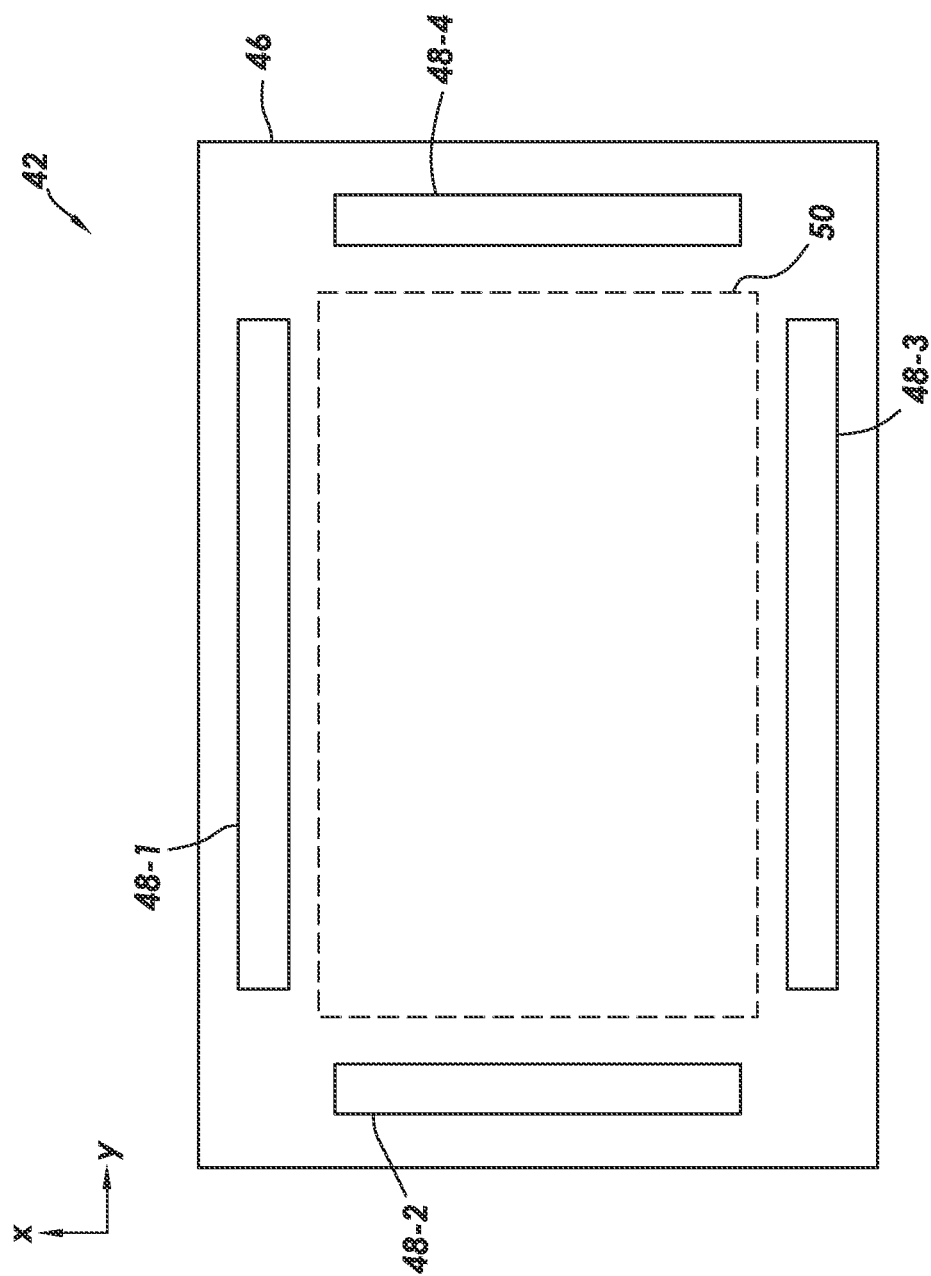
FIG. 5 is a plan view of an illustrative ASIC (application-specific integrated circuit) die in accordance with some embodiments.

FIG. 5 is a plan view of an ASIC die such as die 42, the peripheral side view of which is shown in FIG. 3. In the example of FIG. 5, integrated circuit die 42 may include a semiconductor substrate 46 such as a silicon substrate on which circuitry blocks 48 (referring to circuitry blocks 48-1, 48-2, 48-3, and 48-4, collectively) are formed by fabricating passive and active electrical structures that are interconnected in a suitable manner to achieve one or more dedicated functions.

As shown in FIG. 5, circuitry blocks 48 may be formed along the peripheral edges of substrate 46. Circuitry blocks 48-1 and 48-3 may be formed along the top and bottom peripheral edges of substrate 46. Circuitry blocks 48-2 and 48-4 may be formed along the left and right peripheral edges of substrate 46. One or more of circuitry blocks 48 may implement row control circuitry 26 in FIG. 2 and/or other pixel control functions, may implement column readout circuitry 28 in FIG. 2 and/or other pixel readout functions, may implement control and processing circuitry 24 in FIG. 2 and/or other general timing control and/or signal processing functions, and/or may implement support and peripheral functions such as clocking functions, input-output interface function, and power management functions.

In one illustrative arrangement, circuitry blocks 48-1 and 48-3 may implement at least pixel readout functions by forming column readout circuitry 28 in FIG. 2. As an example, circuitry block 48-1 may receive pixel output signals from a first set of pixels using a first set of columns lines coupled to the first set of pixels arranged in a first set of columns. Circuitry blocks 48-3 may receive pixel output signals from a second set of pixels using a second set of column lines coupled to the second set of pixels arranged in a second set of columns. If desired, one of circuitry blocks 48-1 and 48-3 may be omitted, and the other one of circuitry blocks 48-1 and 48-3 may be coupled to all of the column lines and receive all pixel output signals from all of the pixels in the array.

In one illustrative arrangement useable in combination with the above-mentioned arrangements of circuitry blocks 48-1 and/or 48-3, circuitry blocks 48-2 and 48-4 may implement at least pixel control functions by forming row control circuitry 26 in FIG. 2. As an example, circuitry block 48-2 may provide pixel control signals to a first set of pixels using a first set of row lines coupled to the first set of pixels arranged in a first set of rows. Circuitry blocks 48-4 may provide pixel control signals to a second set of pixels using a second set of row lines coupled to the second set of pixels arranged in a second set of rows. If desired, one of circuitry blocks 48-2 and 48-4 may be omitted, and the other one of circuitry blocks 48-2 and 48-4 may be coupled to all of the row lines and provide all pixel control signals to all of the pixels in the array.

As shown in FIG. 5, when die 40 is mounted to die 42, pixel array 20 on die 40 may have a footprint 50 with respect to circuitry blocks 48 on die 42. Although pixel array 20 and circuitry blocks 48 are not co-planar with each other, circuitry blocks 48 may still run along the peripheral edges of footprint 50 of pixel array 20, thereby facilitating the desired column and row conductive line routing in the manner shown with lines 30 and 32 in FIG. 2 through inter-die connections using interconnect structures 41 and 43 as shown in FIG. 3. In some illustrative arrangements, pixel array 20 may have an expanded footprint larger than footprint 50 that overlaps one or more of circuitry blocks 48.

In some illustrative arrangements, sensor integrated circuit die 40 and ASIC die 42 may be implemented based on stitching. In other words, dies 40 and 42 may each be a stitched die. In particular, one or more stitched dies formed using one-dimensional or two-dimensional stitching may be constructed using a step and repeat exposure process using a small number of tiles, such as four or five tiles, contained on a single reticle set. As an example, each tile may be exposed at multiple locations across sensor die and/or the ASIC die, thereby forming multiple instances of the same circuitry at these locations.

As an example, a reticle set may include a left-and-right peripheral tile, a top-and-bottom peripheral tile, a corner peripheral tile, and a center tile. Sensor integrated circuit die 40 may implement a pixel array 20 by stitching multiple instances of the center pixel array tile to form a pixel array 20. If desired, the center tiles may also form non-pixel circuitry such as some portions of the pixel control and/or readout circuitry and other functional circuitry. ASIC die 42 may implement one or more of circuitry blocks 48-1, 48-2, 48-3, and 48-4 by stitching multiple instances of the left-and-right peripheral tile, and the top-and-bottom peripheral tile and implement other circuitry blocks such as clocking circuitry, power management circuitry, and/or input-output interface by stitching multiple instances of the corner peripheral tile. If desired, the peripheral and corner tiles may also define some image sensor pixel circuitry and form some portions of the pixel array.

If desired, sensor integrated circuit die 40 and ASIC die 42 may be formed using other processes. In other words, one or both of dies 40 and 42 may not be stitched dies. Furthermore, if desired, image sensor 16 as shown in FIG. 2 may be formed using a monolithic architecture in which at least pixel array 20, row control circuitry 26, and column readout circuitry 28 are formed on a single integrated circuit die.

An image sensor pixel array such as pixel array 20 may include different types of pixels. In particular, active image sensor pixels may be used to generate image signals corresponding to incident light from a scene. The image signals from these active image sensor pixels may be processed to form one or more image frames corresponding to the scene. However, active image sensor pixels may be susceptible to noise. In other words, the generated image signals may be noisy or have a less than desired signal-to-noise ratio (SNR).

One illustrative type of noise may be row-wise fixed pattern noise. Row-wise fixed pattern noise may occur because each row of active pixels in the array may be coupled to a different set of row control lines and be operated differently by row driver circuitry, thereby may experience electrical and/or physical asymmetries with respect to other rows. Because of the varying operating conditions such the control scheme and/or the location of pixels relative to one another across different rows, image signal generated across different rows exhibits different noise. This noise is particular noticeable across multiple image frames because the different noise exhibited across the pixel rows are consistent across the image frames, leading to more noticeable fixed patterns or artifacts when viewing these image frames in succession.

One way to mitigate this type of row-wise fixed pattern noise and/or other types of noise is to include one or more reference image sensor pixels in each pixel row of the pixel array. These reference pixels may generate reference signals indicative of the type of noise experienced by each row due to electrical and/or physical asymmetries. The reference signals may be processed to characterize the underlying asymmetry between rows. Corresponding one or more correction factors may be applied to image data based on the reference signals. The image signals generated by the active pixels may be corrected or compensated using these correction factors to reduce the effects of row-wise fixed pattern noise.

Figure 6:
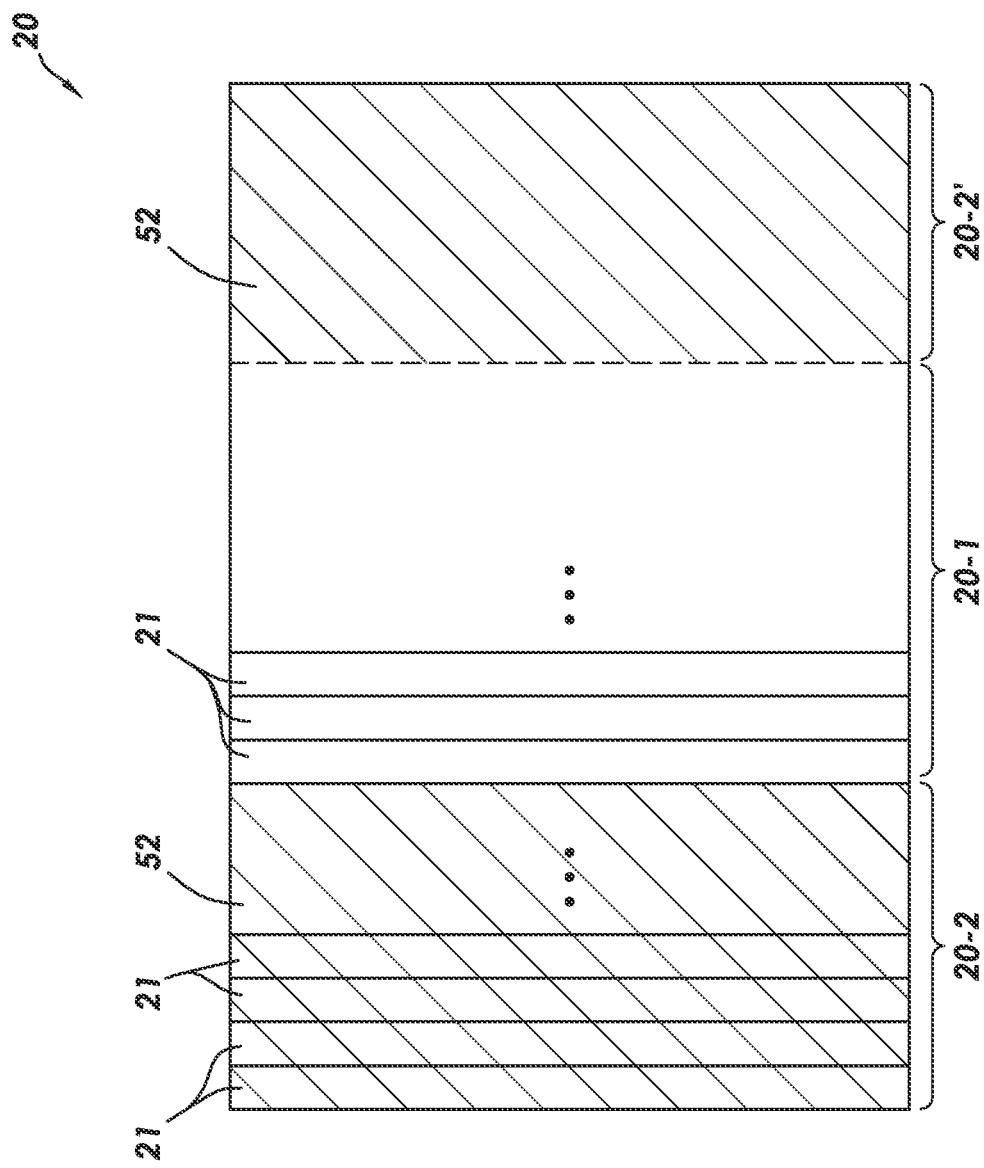
FIG. 6 is a diagram of an illustrative image sensor pixel array having active image sensor pixel columns and reference image sensor pixel columns in accordance with some embodiments.

FIG. 6 is a diagram of an illustrative image sensor pixel array such as pixel array 20 having active image sensor pixels for generating the image signals and reference sensor pixels for generating reference signals used to compensate for noise in the image signals.

As shown in FIG. 6, pixel array 20 includes pixel columns 21 of active image sensor pixels in region 20-1 of pixel array 20. Pixel array 20 may also include pixel columns 21 of reference image sensor pixels in region 20-2 of pixel array 20. If desired, pixel array 20 may include additional reference pixels in region 20-2' on a side of pixel array 20 opposite the side of pixel array 20 on which reference pixels in region 20-2 are provided. Reference pixels may generally be placed at any suitable location on pixel array 20.

To properly compensate for the fixed pattern noise, reference pixels in region 20-1 may have the same physical structure or be implemented and operated in the same manner as active pixels in region 20-1, while being shielded from incident light. In the example of FIG. 6, pixels in region 20-2 and region 20-2' may be overlapped or covered by a light shield 52 such that the reference pixels, and more specifically their photodiodes and other photosensitive elements, are configured not to receive any incident light from the scene. Light shield 52 may include planar opaque structures extending parallel to the substrate surface in which photosensitive elements and other pixel elements are formed to provide shielding from direct incident light, may include peripheral opaque structures such as opaque walls that provide shielding from stray incident light, and/or may generally include other type of opaque structures that provide shielding from environmental light.

Any given reference pixel and any given active image sensor pixel (at least in the same row if not across the entire array) may include the same element such as photodiodes, floating diffusion regions, transistors, capacitors, any other pixel elements, may have the same interconnection between these elements. As examples reference pixels and active pixels may have the same pixel structure, may be pixels of the same type, and/or may be pixels with the same functionality, and/or may have the same external connections to the row lines and/or the column lines. Because reference pixels and active pixel have the same configuration or similar configurations, the reference pixel and the active pixel in the same row may be subject and experience the same operating conditions, with the difference being that active pixels receive incident light while reference pixels do not. As such, the reference signals generated and read out from reference pixels may be largely indicative of physical placement and/or electrical control factors contributing to row-wise fixed pattern noise and/or other noise.

Multiple reference signals from reference pixels in the same row may be averaged and the averaged reference signal may be used to generate correction factors that correct for fixed pattern noise image data generated by active pixels. The signal used for correction and generated based on the reference pixel output is summed with the active pixel. The correction signal has a random content, so the more reference pixels are averaged the bigger the reduction in random variation. Since this correction signal is added to the active signal, any residual random noise will be added to the row so introducing a fixed noise across the whole row.

As such, as the number of these reference signals being averaged increases, the improvement in the correction or suppression of fixed pattern noise also increases due to decreased residual random noise. In particular, the suppression of the average noise may scale as a factor of the square root of the number of reference pixel columns.

While an increase in the number of reference pixel columns is beneficial to noise reduction, this can come at a cost of active pixel area. In other words, for the same array size (e.g., if the dimensions of array 20 are kept the same), an increase in the number of reference pixel columns may lead to a decrease in the number of active pixel columns, thereby reducing active pixel resolution or image resolution.

This tradeoff may further be exacerbated in image sensor configurations in which an image sensor is implemented using a stacked die configuration such as the stacked die configuration described in connection with FIGS. 3-5 and/or implemented using a stitched die configuration in which a reticle set having a fixed number of tiles or mask is used in a step-and-repeat manufacturing process. As an example, in a stacked die configuration, the inclusion of these additional reference columns may require additional inter-die connections in addition to limiting the active pixel resolution. The stacked readout and/or image processing die may also need to be larger to accommodate for a larger array in some scenarios. As another example, in a stitched die configuration, the inclusion of these additional reference columns may require a different and likely larger reticle set to meeting active pixel array resolution requirements as a result of the multiple step and repeat process associated with stitched dies.

In view of these tradeoffs, it may be desirable to provide an image sensor configuration that strictly improves at least one of noise reduction and/or active pixel resolution while limiting adverse impacts on the other.

Figure 7:
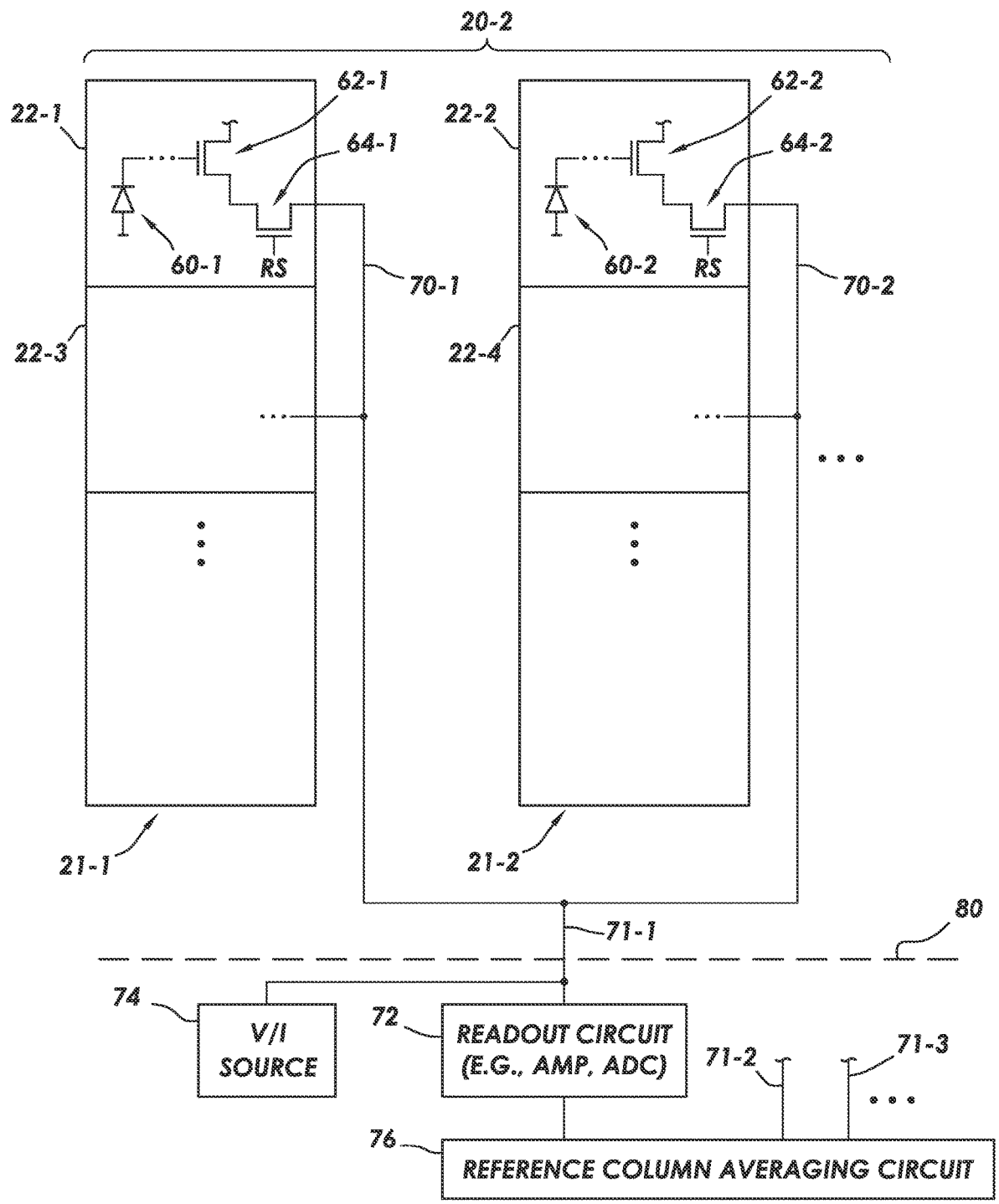
FIG. 7 is a diagram of illustrative reference image sensor pixel columns coupled to a shared readout path in accordance with some embodiments.

FIG. 7 is a diagram of an illustrative portion of an image sensor such as image sensor 16 in FIGS. 1-3. In particular, FIG. 7 shows two illustrative reference pixel columns 21-1 and 21-2 in region 20-2 (FIG. 6) of image sensor array 20. Reference pixel columns 21-1 and 21-2 may be adjacent pixel columns or may be separated by one or more intervening reference, active, or other pixel columns. Each reference column may include a number of reference pixels 22, each in a corresponding row of pixel array 20, and all covered by a light shield such as light shield 52 in FIG. 6.

In the example of FIG. 7, reference pixel column 21-1 may include reference pixels 22-1, 22-3, etc., while reference pixel column 21-2 may include reference pixels 22-2, 22-4, etc. Reference pixels 22-1 and 22-2 may in the same row of pixel array 20, reference pixels 22-3 and 22-4 may be in the same row of pixel array 20, and so on. In other words, each reference pixel in column 21-1 may be in the same row with a corresponding reference pixel in column 22-2.

To minimize the number of readout paths coupled to reference pixel columns 21-1 and 21-2, reference pixel columns 21-1 and 21-2 may share at least a portion of a readout path. As shown in the example of FIG. 7, a first pixel column readout path 70-1 may be coupled to the output path of each reference pixel 22 in reference pixel column 21-1, and a second pixel column readout path 70-2 may be coupled to the output path of each reference pixel 22 in reference pixel column 21-2.

Separate pixel column readout paths 70-1 and 70-2 may merge at a common node into a shared or common readout path and/or line 71-1. Shared line 71-1 may be coupled to one or more readout circuits shared by pixel columns 21-1 and 21-2. The use of the shared line 71-1 may enable source follower binning, which refers to the output of the source follower transistors in multiple pixels being coupled to a common node or path.

In particular, as shown in FIG. 7, reference pixel 22-1 may include a photosensitive element such as photodiode 60-1. Photodiode 60-1 may be coupled directly or through one or more intervening transistors, charge storage structures, and/or other pixel elements to a floating diffusion region at the gate terminal of source follower transistor 62-1. Source follower transistor 62-1 may have a first terminal such as a drain terminal coupled to a reference voltage terminal and a second terminal such as a source terminal coupled to column line 70-1. A row select transistor 64-1 may be interposed along the pixel output path between source follower transistor 62-1 and readout path 70-1. Each reference pixel and active pixel in pixel array 20 may have the same configuration as described in connection with reference pixel 22-1.

By providing a common readout path 71-1, source follower transistor outputs from reference pixels such as from pixels 22-1 and 22-2, from pixels 22-3 and 22-4, and/or from other sets of pixels in columns 21-1 and 21-2 may be averaged. Given that reference signals output from reference pixels have relatively low and similar magnitudes, performing source follower binning across these reference pixels may result in a relatively good average of source follower outputs.

In one illustrative arrangement, readout circuit 72 coupled to common readout path 71-1 may include an amplifier and an analog-to-digital converter downstream from and coupled to the amplifier. A current source and/or a voltage source forming part of a readout path pre-charging circuit may be coupled to common readout path 71-1 to help drive signals off of pixels and onto common readout path 71-1. The output from readout circuit 72, or more specifically from the analog-to-digital converter in readout circuit 72, may be coupled to reference column averaging circuit 76.

Reference column averaging circuit 76 may be coupled to additional common readout paths such as common readout paths 71-2, 71-2, etc., each shared by other sets of reference pixel columns. Reference column averaging circuit 76 may perform additional averaging operations between the source-follower-binned or averaged reference signals received along each of the common readout paths 71-1 for each given reference pixel row. As an example, reference column averaging circuit 76 may be implemented using any suitable digital arithmetic circuit performing adder, divider, or other arithmetic functions, may be implemented on compute circuitry on image signal processors, and/or on any other suitable circuitry for performing data averaging functions.

Reference column averaging circuit 76 may output a final averaged reference signal value for each given row of pixel array 20. Based on this set of final averaged reference signal values, each value corresponding to a row of pixel array 20, image processing circuitry such as control and processing circuitry 24 and/or storage and processing circuitry 18 in FIGS. 1 and 2 may generate appropriate correction factors that correct for row-wise asymmetries and apply the correction factors to each applicable row of image data, thereby producing one or more image frames that have been compensated for fixed pattern noise.

In particular, similar to readout operations for active pixels, readout operations for reference pixels may occur in a row-wise manner. A row select transistor such as transistor 64 may be coupled along the pixel output path of each reference and active pixel 22. Row control circuitry such as row control circuitry 26 in FIG. 2 may provide each row of reference pixels and active pixels with the same asserted control signal RS to perform readout operations and therefore source follower binning operations for the reference pixels having a shared readout path.

The configuration shown in FIG. 7 is merely illustrative. A common readout path 71 such as path 71-1 may be shared amongst more than two reference pixel columns, three reference pixel columns, four reference pixel columns, more than four reference pixel columns, half of all of the reference pixel columns, or all of the reference pixel columns, as just a few examples. Any suitable number of reference pixel columns may be coupled to other common readout paths such as paths 71-2, 71-3, etc. While separate readout paths 70-1 and 70-2 are shown in FIG. 7 to be shared by each reference pixel 22 in that corresponding column, this is also merely illustrative. If desired, pixels in the same column may be merged at different common nodes, and the different common nodes may be connected by a shared column line. In general, any configuration of suitable reference pixel lines may be used to achieve source follower binning across a desired set of reference pixels.

The illustrative readout scheme for reference pixel columns using common readout nodes and/or paths may help reduce the number of total readout paths and corresponding readout circuits that need to be provided within image sensor 16. This readout scheme may therefore help reduce the area required for readout circuitry such as circuitry 28 in FIG. 2.

In one illustrative example, pixel circuitry in region 20-2 and the corresponding readout circuitry may be implemented on separate dies such as dies 40 and 42 as described in connection with FIGS. 3-5. Dashed line 80 may separate a first portion of image sensor 16 from a second portion of image sensor 16. The first portion of image sensor 16 may include pixels 22, corresponding pixel output paths 70, merged nodes where multiple pixel output paths of pixels in the same row are combined, and/or other elements. If desired, the first portion of image sensor 16 may be formed on a first image sensor die such as die 40. The second portion of image sensor 16 may include merged pixel readout paths 71, current sources and/or pre-charging circuitry, readout circuits 72, reference column averaging circuits 76. If desired, the second portion of image sensor 16 may be formed on a second ASIC die such as die 42. Pixel readout paths 71 may each include a corresponding portion formed from inter-die connection structures such as structures 41 and 43.

In some illustrative arrangements, the merged nodes at which multiple pixel output paths from multiple reference pixels 22 in the same row are merged may be on the second ASIC die instead of on the first image sensor die as depicted in FIG. 7.

Figure 8:
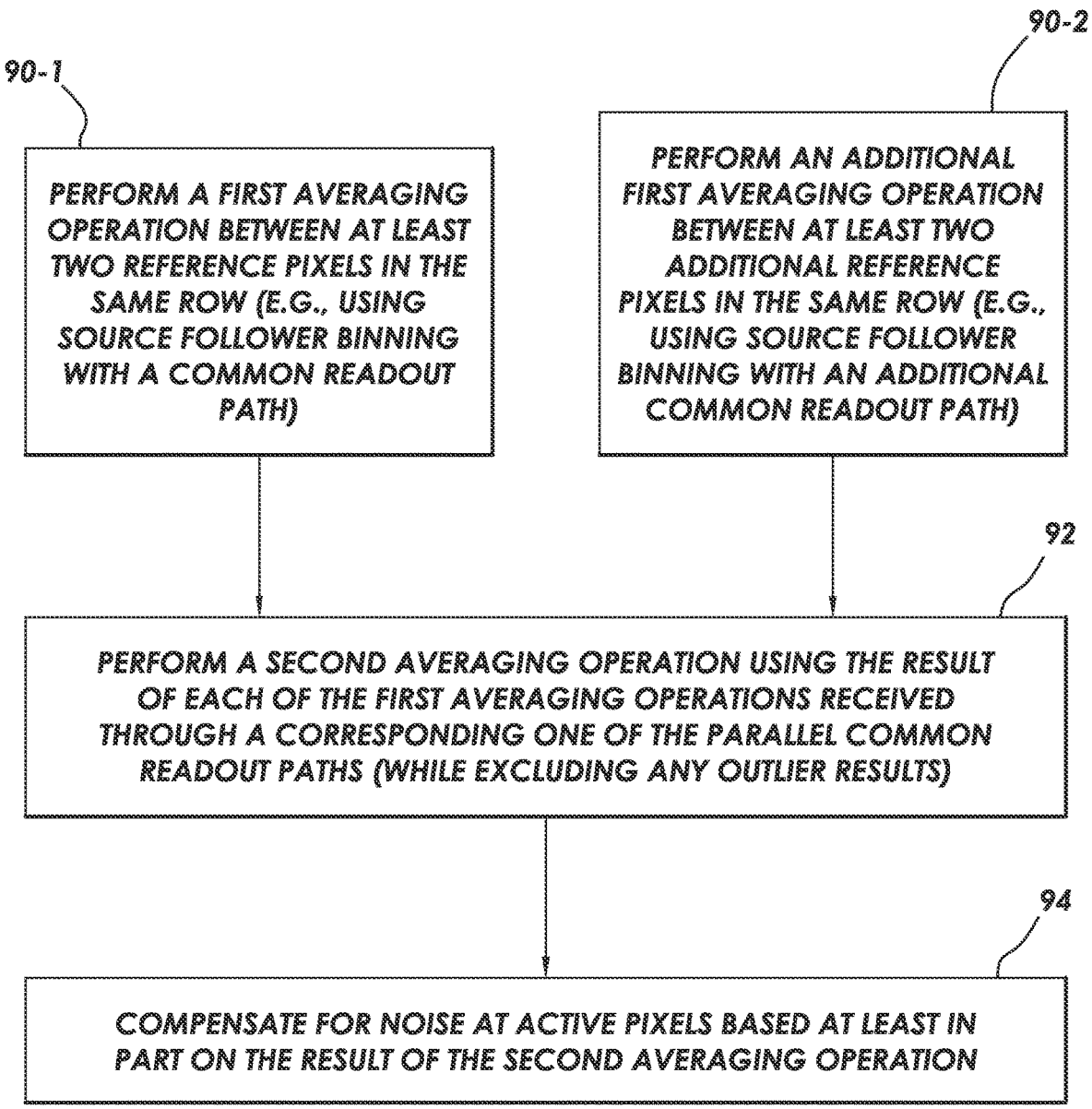
FIG. 8 is a flowchart of illustrative operations for performing noise compensation using reference pixels in accordance with some embodiments.

FIG. 8 is a flowchart showing illustrative operations for generating reference data for image noise correction using reference pixels.

In particular, at operations 90-1 and 90-2, row control circuitry such as row control circuitry 26 in FIG. 2 may assert a row select control signal RS for a given row of reference pixels and active pixels. Source follower transistor outputs from a first set of reference pixels in that row coupled to a first common readout path may be averaged based on source follower binning at operation 90-1. Source follower outputs from a second set of reference pixels in that row coupled to a second common readout path may be averaged based on source follower binning at operation

90-2. These averaging operations using source follower binning may be referred to as first averaging operations.

While two first averaging operations are shown in the example of FIG. 8, this is merely illustrative. If desired, any suitable number of first averaging operations based on source follower binning with a common readout path may occur. These first averaging operations such as operations 90-1, operation 90-2, and other analogous operations for reference pixels of the same row may occur in parallel. Operations 90 may produce a set of average reference signal values.

At operation 92, column readout circuitry such as column readout circuitry 28 in FIG. 2, which can include reference column averaging circuit 76, may perform a second averaging operation using the results of each of the first averaging operations. If desired, outlier results such as one or more results that exceed a threshold difference with respect to the remaining results, an average of the remaining results, a minimum of the remaining results, and/or any other values may be removed from being used in the second averaging operation at operation 92.

Operation 92 may produce, for a given pixel row, a single final averaged reference signal value such as an average value of averages based on the set of average reference signal values that result from operations 90 for that given pixel row.

At operation 94, column readout circuitry such as columns readout circuitry 28 and/or control and processing circuitry such as control circuitry 24 or control circuitry 18 may compensate for noise at active pixels based at least in part on the result of operation 92. In particular, a set of final averaged reference signal values, each for a different pixel row, may provide a corresponding set of correction factors. Image processing circuitry may perform image data correction for one or more image frames based on the set of correction factors.

In other words, operations 90 and 92 may be repeated to read out and average reference pixel outputs from each row of reference pixels, which results in a final average (average of average) reference signal value for each reference pixel row. These final average values may be compared to each other or generally be used to characterize the varying electrical control and/or physical placement effects on different pixel rows. These differences in effects may be used to compensate for row-wise fixed pattern noise for the active pixels.

Various embodiments have been described illustrating image sensors with reference pixel columns having a shared readout path.

As a first example, an image sensor may include an array of image sensor pixels that includes active image sensor pixels and reference pixels that are optically shielded by being covered by a light shield. The reference pixels may include a first reference pixel in a first column of the array and a second reference pixel in a second column of the array. A first readout path may be coupled to the first reference pixel, and a second readout path may be coupled to the second reference pixel. The first and second readout paths may be merged at a common node. If desired, readout paths for additional reference pixels may also be merged at the common node. A shared readout path may be coupled between the common node and a readout circuit such as an amplifier, an analog-to-digital converter, and/or a current source or a pre-charging circuit. A reference column averaging circuit implemented as a part of or separately from an image processor or image processing circuitry may be coupled to the analog-to-digital converter.

If desired, two or more corresponding readout paths coupled to two or more additional reference pixels may be merged at an additional common node. The first reference pixel, the second reference pixel, and the two or more additional reference pixels may be formed in a same row of the array. An additional shared readout path may be coupled between the additional common node and an additional readout circuit. The image processing circuitry may be configured to perform noise compensation for image data generated by the active image sensor pixels based on reference data generated based on a first reference signal from the readout circuit and a second reference signal from the additional readout circuit.

The first reference pixel may include a first source follower transistor configured to provide an output of the first reference pixel. The second reference pixel may include a second source follower transistor configured to provide an output of the second reference pixel. The output of the first reference pixel and the output of the second reference pixel may be configured to be (source-follower-binned) averaged via the common node to generated an (source-follower-binned) averaged output. The shared readout path may be configured to convey the averaged output to the readout circuit.

As a second example, an image sensor may include: a first integrated circuit die having an image sensor pixel array that includes a first reference pixel in a first column of the image sensor pixel array and a second reference pixel in a second column of the image sensor pixel array; and a second integrated circuit die mounted to the first integrated circuit die and having a reference pixel readout path shared between the first reference pixel and the second reference pixel and having a readout circuit coupled to the reference pixel readout path. A readout path of the first reference pixel may be merged with a readout path of the second reference pixel at a common node. The common node may be coupled to the readout circuit via the reference pixel readout path. In one arrangement, the common node may be in the first integrated circuit die, and a portion of the reference pixel readout path may be formed using inter-die connection structures. In another arrangement, the common node may be in the second integrated circuit die.

As a third example, a method of image noise correction may include. generating, via active image sensor pixels, image data. The method may include performing source follower binning for a set of reference image sensor pixels that are optically shielded to generate a source-follower-binned reference pixel output value. The method may further include performing source follower binning for an additional set of reference image sensor pixels that are optically shielded to generate an additional source-follower-binned reference pixel output value. The method may include applying one or more correction factors to the image data based on the source-follower-binned reference pixel output value and the additional source-follower-binned reference pixel output value.

It will be recognized by one skilled in the art that the present exemplary embodiments may be practiced without some or all of these specific details. In other instances, well-known operations have not been described in detail in order not to unnecessarily obscure the present embodiments.

The foregoing is merely illustrative and various modifications can be made to the described embodiments. The foregoing embodiments may be implemented individually or in any combination.

What is claimed is:

1. An image sensor comprising:
   an array of image sensor pixels that includes active image sensor pixels and reference pixels, the reference pixels having a first reference pixel in a first column of the array and a second reference pixel in a second column of the array;
   a first readout path coupled to the first reference pixel;
   a second readout path coupled to the second reference pixel, wherein the first and second readout paths are merged at a common node;
   a readout circuit; and
   a shared readout path coupled between the common node and the readout circuit.

2. The image sensor defined in claim 1 further comprising:
   a light shield that covers the reference pixels.

3. The image sensor defined in claim 1, wherein the first reference pixel comprises a first source follower transistor configured to provide an output of the first reference pixel and wherein the second reference pixel comprises a second source follower transistor configured to provide an output of the second reference pixel.

4. The image sensor defined in claim 3, wherein the output of the first reference pixel and the output of the second reference pixel are configured to be averaged via the common node to generate an averaged output.

5. The image sensor defined in claim 4, wherein the shared readout path is configured to convey the averaged output to the readout circuit.

6. The image sensor defined in claim 1, wherein the readout circuit comprises an amplifier.

7. The image sensor defined in claim 6, wherein the readout circuit comprises an analog-to-digital converter coupled to the amplifier.

8. The image sensor defined in claim 7 further comprising:
   a reference column averaging circuit coupled to the analog-to-digital converter.

9. The image sensor defined in claim 1, wherein the reference pixels include one or more additional reference pixels coupled to one or more corresponding readout paths, each of the one or more corresponding readout paths being merged at the common node.

10. The image sensor defined in claim 1, wherein the reference pixels include two or more additional reference pixels coupled to two or more corresponding readout paths, the two or more corresponding readout paths being merged at an additional common node.

11. The image sensor defined in claim 10, wherein the first reference pixel, the second reference pixel, and the two or more additional reference pixels are formed in a same row of the array.

12. The image sensor defined in claim 11 further comprising:
   an additional readout circuit; and
   an additional shared readout path coupled between the additional common node and the additional readout circuit.

13. The image sensor defined in claim 12 further comprising;
   image processing circuitry configured to perform noise compensation for image data generated by the active image sensor pixels based on reference data generated based on a first reference signal from the readout circuit and a second reference signal from the additional readout circuit.

14. The image sensor defined in claim 1, wherein the first and second reference pixels are formed in a first integrated circuit die and wherein the readout circuit and at least a portion of the shared readout path are formed in second integrated circuit die mounted to the first integrated circuit die.

15. The image sensor defined in claim 14, wherein the common node is in the first integrated circuit die.

16. The image sensor defined in claim 15, wherein the shared readout path comprises an inter-die connection structure.

17. The image sensor defined in claim 14, wherein the common node is in the second integrated circuit die.

18. The image sensor defined in claim 1 further comprising:
   an additional readout circuit coupled to third and fourth reference pixels in the reference pixels via an additional shared readout path; and
   a reference column averaging circuit coupled to the readout circuit and the additional readout circuit.

19. An image sensor comprising:
   an array of image sensor pixels that is in a first integrated circuit die and that includes active image sensor pixels and first and second reference pixels in first and second respective columns of the array;
   a first readout path coupled to the first reference pixel;
   a second readout path coupled to the second reference pixel;
   a shared readout path, wherein the first and second readout paths merge into the shared readout path; and
   a readout circuit coupled to the shared readout path and in a second integrated circuit die mounted to the first integrated circuit die.

20. An image sensor comprising:
   active image sensor pixels that generate image signals;
   first and second reference pixels that each generate a reference signal;
   a first readout path coupled to the first reference pixel;
   a second readout path coupled to the second reference pixel;
   a shared readout path, wherein the first and second readout paths merge into the shared readout path; and
   a readout circuit configured to receive, via the shared readout path and the first and second readout paths, a source-follower-binned output value based on the reference signals generated by the first and second reference pixels.

* * * * *